(12) United States Patent
Kono

(10) Patent No.: US 11,448,969 B2
(45) Date of Patent: Sep. 20, 2022

(54) ILLUMINATION OPTICAL SYSTEM, EXPOSURE APPARATUS, AND ARTICLE MANUFACTURING METHOD

(71) Applicant: CANON KABUSHIKI KAISHA, Tokyo (JP)

(72) Inventor: Michio Kono, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/853,552

(22) Filed: Apr. 20, 2020

(65) Prior Publication Data
US 2020/0249580 A1    Aug. 6, 2020

Related U.S. Application Data

(63) Continuation of application No. PCT/JP2018/038123, filed on Oct. 12, 2018.

(30) Foreign Application Priority Data

Oct. 24, 2017  (JP) .............................. JP2017-205643

(51) Int. Cl.
*G03F 7/20* (2006.01)
*G02B 26/08* (2006.01)

(52) U.S. Cl.
CPC ..... *G03F 7/70291* (2013.01); *G02B 26/0841* (2013.01); *G03F 7/7015* (2013.01);
(Continued)

(58) Field of Classification Search
CPC . G03F 7/70058–70241; G03F 7/70283; G03F 7/70291; G03F 7/70308–70325; G03F 7/70358; G03F 7/7055; G03F 7/70566; G03F 7/70941; G03F 7/70383; G03F 7/20; G02B 26/0841; G02B 3/0056; G02B 27/0927; G02B 27/0961; G03B 21/08
(Continued)

(56) References Cited

U.S. PATENT DOCUMENTS 5,719,704 A * 2/1998 Shiraishi ............. G03F 7/70075
355/53
5,923,475 A * 7/1999 Kurtz ................. G02B 19/0057
359/619
(Continued)

FOREIGN PATENT DOCUMENTS

CN    101916064 A    12/2010
EP     2876498 A1     5/2015
(Continued)

*Primary Examiner* — Christina A Riddle
(74) *Attorney, Agent, or Firm* — Canon U.S.A., Inc. IP Division

(57) ABSTRACT

An illumination optical system of the present invention includes a first lens array FE including a plurality of lens cells dividing a light flux emitted from a light source into a plurality of light fluxes, a second lens array MLAi including lens cells on which spot lights exiting from the lens cells included in the first lens array FE are condensed, and a first optical member IL3 imaging the spot light, which has been condensed on the lens cell included in the second lens array MLAi, on one of optical modulation elements constituting an optical modulation unit.

15 Claims, 6 Drawing Sheets

(52) U.S. Cl.
CPC ...... *G03F 7/70208* (2013.01); *G03F 7/70566* (2013.01); *G03F 7/70941* (2013.01)

(58) Field of Classification Search
USPC .............................. 355/30, 52–55, 67–71, 77
See application file for complete search history.

(56) References Cited

U.S. PATENT DOCUMENTS

| | | | |
|---|---|---|---|
| 6,195,196 B1 | 2/2001 | Kimura et al. | |
| 2002/0097495 A1* | 7/2002 | Mei ................... | G03F 7/70291 359/618 |
| 2003/0043356 A1* | 3/2003 | Shiraishi ............ | G03F 7/70333 355/53 |
| 2004/0027681 A1 | 2/2004 | Sunagawa et al. | |
| 2004/0213530 A1 | 10/2004 | Omori | |
| 2005/0219493 A1 | 10/2005 | Oshida et al. | |
| 2006/0147841 A1* | 7/2006 | Ohmi ................. | G03F 7/70291 430/311 |
| 2007/0165202 A1* | 7/2007 | Koehler ............. | G03F 7/70116 355/67 |
| 2009/0296064 A1* | 12/2009 | Cobb ................. | G03F 7/70275 355/71 |
| 2014/0320835 A1* | 10/2014 | Fujiwara ............ | G01M 11/005 355/67 |
| 2015/0185622 A1* | 7/2015 | Patra .................. | G03F 7/70075 355/67 |
| 2015/0205212 A1* | 7/2015 | Lee .................... | G03F 7/70275 355/71 |
| 2017/0293229 A1* | 10/2017 | Godfried ............ | G03F 7/7085 |

FOREIGN PATENT DOCUMENTS

| | | |
|---|---|---|
| JP | H10-175325 A | 6/1998 |
| JP | H11-271650 A | 10/1999 |
| JP | 2004-39871 A | 2/2004 |
| JP | 2004-62155 A | 2/2004 |
| JP | 2004-228343 A | 8/2004 |
| JP | 2005-31280 A | 2/2005 |
| JP | 2005-345591 A | 12/2005 |
| JP | 2007-179039 A | 7/2007 |
| JP | 2014-107309 A | 6/2014 |
| JP | 2017-54131 A | 3/2017 |
| KR | 10-2011-0020869 A | 3/2011 |
| KR | 10-2014-0063761 A | 5/2014 |
| KR | 10-2015-0053995 A | 5/2015 |

* cited by examiner

ILLUMINATION OPTICAL SYSTEM, EXPOSURE APPARATUS, AND ARTICLE MANUFACTURING METHOD

CROSS-REFERENCE TO RELATED APPLICATIONS

This application is a Continuation of International Patent Application No. PCT/JP 2018/038123, filed Oct. 12, 2018, which claims the benefit of Japanese Patent Application No. 2017-205643, filed Oct. 24, 2017, both of which are hereby incorporated by reference herein in their entirety.

BACKGROUND OF THE INVENTION

Field of the Invention

The present invention relates to an illumination optical system, an exposure apparatus, and an article manufacturing method using them.

Description of the Related Art

There is known an exposure apparatus for transferring a pattern of an original (mask) to a photosensitive substrate through a projection optical system. Recently, with an increasing size of the substrate subjected to exposure by the exposure apparatus, the mask in which the pattern is formed has also been increasing. The larger size of the mask increases the cost of the mask itself, prolongs the manufacturing time of the mask, and increases the manufacturing cost of the mask.

Under that situation, an attention is focused on the so-called maskless exposure apparatus capable of forming a pattern on a substrate without using a mask in which the pattern is formed. The maskless exposure apparatus is a digital exposure apparatus using an optical modulator such as a Digital Micromirror Device (DMD). According to the maskless exposure apparatus, the pattern can be formed on the substrate without using the mask by generating exposure light corresponding to an exposure pattern with the DMD, and by performing exposure in accordance with pattern data, which corresponds to the exposure pattern, on the substrate.

Japanese Patent Application Laid-Open No. 2004-62155 discloses an exposure apparatus in which image exposure in accordance with image data is performed by making a laser beam emitted from a laser emission unit incident on individual optical modulation elements of an optical modulation unit, and by modulating the incident laser beam into either an exposure state or a non-exposure state with each optical modulation element.

In the exposure apparatus disclosed in Japanese Patent Application Laid-Open No. 2004-62155, the laser beam emitted from a fiber-array light source, which is included in an illumination unit disposed on the light incident side of the DMD, is condensed on the DMD for illuminating the DMD with the laser beam at a time.

FIG. 6 illustrates optical paths in the exposure apparatus disclosed in Japanese Patent Application Laid-Open No. 2004-62155. An illumination light flux is selectively modulated and reflected by each of mirrors constituting the DMD, and the reflected light flux enters a projection optical system PO. The light having entered the projection optical system PO is condensed onto a substrate PL through a first optical system L1, a microlens array MLA, a pinhole member PH, and a second optical system L2, which constitute the projection optical system PO.

Here, when the illumination light flux is reflected at a location denoted by a mark x in FIG. 6, the reflected light becomes noise light and causes reduction in resolution performance of exposure light. The location denoted by the mark x in FIG. 6 represents a peripheral region of each of the mirrors constituting the DMD, a gap between adjacent two of the mirrors constituting the DMD, or the like.

As described above, when the DMD is illuminated with the illumination light flux at a time, the reduction in resolution performance of the exposure light may occur due to lights reflected from the peripheral regions of the mirrors constituting the DMD, the gaps between adjacent twos of the mirrors constituting the DMD, and the likes.

An object of the present invention is to provide an illumination optical system and an exposure apparatus each of which can realize an improvement in resolution performance of exposure light.

SUMMARY OF THE INVENTION

The present invention provides an illumination optical system illuminating an optical modulation unit including a plurality of optical modulation elements with a light flux emitted from a light source, the illumination optical system including a first lens array including a plurality of lens cells dividing the light flux emitted from the light source into a plurality of light fluxes, a second lens array including a plurality of lens cells on which spot lights exiting from the lens cells included in the first lens array are condensed, and a first optical member imaging the spot light, which has been condensed on the lens cell included in the second lens array, to one of the optical modulation elements constituting the optical modulation unit.

Further features of the present invention will become apparent from the following description of exemplary embodiments with reference to the attached drawings.

DESCRIPTION OF THE EMBODIMENTS

Embodiments of the present invention will be described in detail below with reference to the drawings. It is to be noted that the present invention is not limited to the following embodiments and the following embodiments are merely practical examples in carrying out the present invention.

First Embodiment

Configurations of an illumination optical system IL and a projection optical system PO according to a first embodiment will be described below with reference to FIG. 1. The optical systems according to this embodiment can be applied to the so-called maskless exposure apparatus in which a pattern can be formed on a substrate without using a mask in which the pattern is formed. In the maskless exposure apparatus, a light flux emitted from the illumination optical system IL is incident on a Digital Micromirror Device (hereinafter referred to as a DMD) that is one type of optical modulator and that serves as an optical modulation unit. Then, exposure light corresponding to an exposure pattern is generated by the DMD and is condensed onto a substrate PL through the projection optical system PO. As a result, exposure in accordance with pattern data corresponding to the exposure pattern is performed on the substrate.

A semiconductor laser or an LED (Light Emitting Diode) is used as a light source LS. The wavelength of a light flux emitted from the light source is determined in accordance with the type of a photosensitive resist that is coated on the substrate PL. The wavelength of the light flux emitted from the light source LS is generally from about 300 nm to about 440 nm.

The configuration of the illumination optical system IL will be described below. The light flux emitted from the light source LS is collimated by an optical system IL1 and illuminates a fly-eye lens FE. Spot light is formed on an exit surface of each lens cell of the fly-eye lens FE, and a size of the formed spot light is determined in accordance with the light emission area of the light source LS, the focal length of the optical system ILL and the focal length of each lens cell of the fly-eye lens FE.

Figure 1:
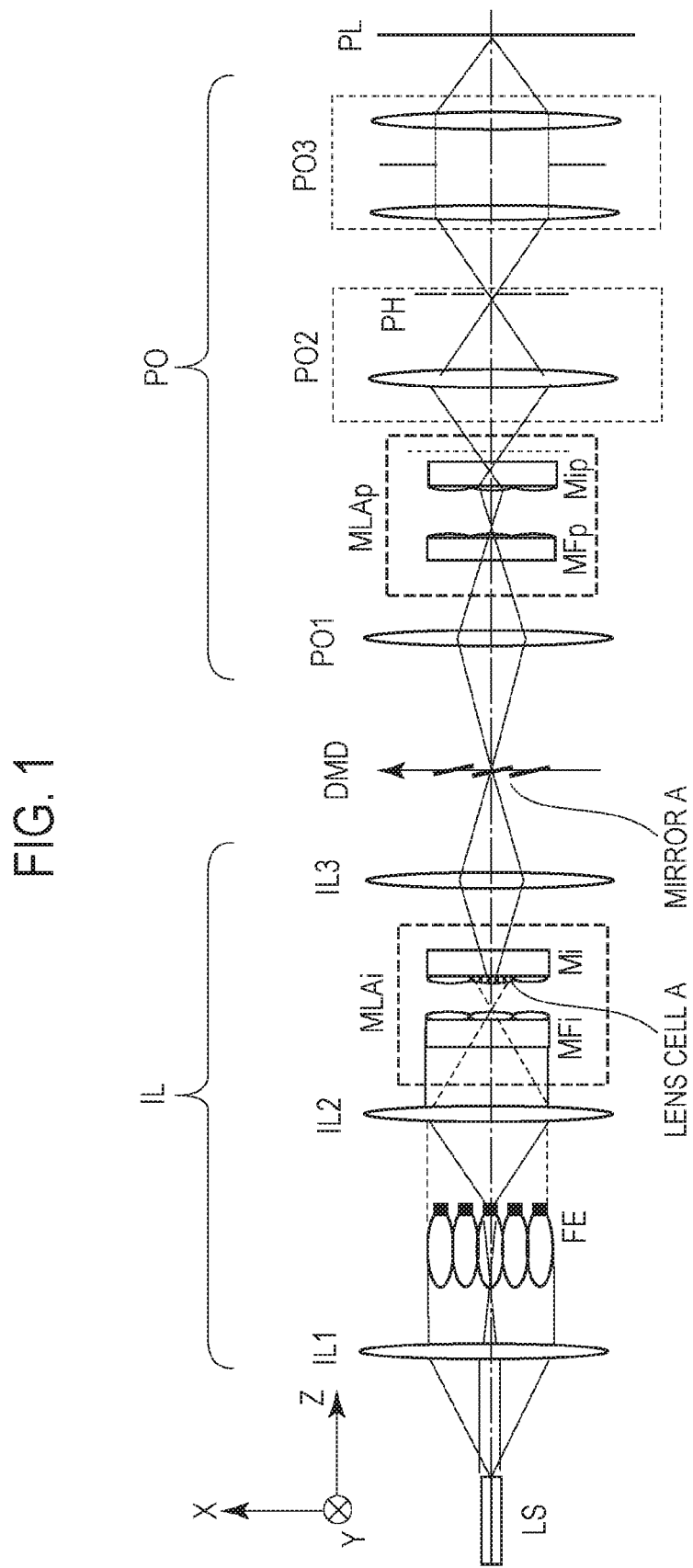
FIG. 1 illustrates a configuration of an illumination optical system according to a first embodiment.

The fly-eye lens FE in FIG. 1 includes a plurality of lens cells arrayed in an XY plane including an X axis and a Y axis that are perpendicular to an optical axis (Z axis) of the illumination optical system IL. In this embodiment, it is assumed that the fly-eye lens FE includes 5×5=25 lens cells. The number of lens cells constituting the fly-eye lens FE can be changed as appropriate.

The light flux diverged by the fly-eye lens FE is collimated by an optical system IL2 (hereinafter also referred to as an optical member B or a second optical member) and illuminates a microlens array MLAi. The microlens array MLAi is constituted by a field lens MFi including a plurality of lens cells and by an imaging lens Mi that is arranged at a position away from the field lens MFi through a distance corresponding to the focal length of the field lens MFi. The imaging lens Mi also includes a plurality of lens cells.

An incident-side surface of the field lens MFi and an exit-side surface of the imaging lens Mi are flat surfaces and have no optical power. In other words, a substantial incident surface of the microlens array MLAi is an exit surface of the field lens MFi, and a substantial exit surface of the microlens array MLAi is an incident surface of the imaging lens Mi.

Here, the fly-eye lens FE, the optical system IL2, and the field lens MFi are arranged such that an exit surface of the fly-eye lens FE is positioned in a front-side focal plane of the optical system IL2 and the exit surface of the field lens MFi is positioned in a rear-side focal plane of the optical system IL2. With such an optical arrangement, the so-called Koehler illumination system is formed, whereby the exit surface of the field lens MFi can be illuminated almost uniformly.

Furthermore, the exit surface of the fly-eye lens FE and the incident surface of the imaging lens Mi are in a conjugate relation by the function of both the optical system IL2 and the field lens MFi. An imaging magnification between an optical image in the exit surface of the fly-eye lens FE and an optical image in the incident surface of the imaging lens Mi is determined in accordance with a ratio of the focal length of the optical system IL2 to the focal length of the field lens MFi. By setting the focal length of the optical system IL2 to be longer than that of the field lens MFi, a plurality of spot lights corresponding to a plurality of spot lights formed in the exit surface of the fly-eye lens FE is formed in one lens cell of the imaging lens Mi. In this embodiment, five spot lights are arrayed in one lens cell of the imaging lens Mi along each of an X-axis direction and a Y-axis direction.

Light fluxes exiting from the microlens array MLAi are imaged on micromirrors, which serve as optical modulation elements constituting the DMD, by the function of an optical system IL3 (hereinafter also referred to as an optical member A or a first optical member). The individual lens cells constituting the imaging lens Mi are in a 1:1 correspondence relation to the individual mirrors constituting the DMD. For example, a spot light is formed on a mirror A of the DMD with an illuminance distribution corresponding to that formed at a lens cell A of the imaging lens Mi. The plurality of micromirrors constituting the DMD is arrayed two-dimensionally and an angle of a reflective surface of each mirror can be changed independently. Accordingly, the light incident on each mirror can be modulated to either an exposure state or a non-exposure state.

The field lens MFi in FIG. 1 includes a plurality of lens cells arrayed in the XY plane. In this embodiment, it is assumed that the field lens MFi includes 3×6=18 lens cells. The number of lens cells constituting the field lens MFi corresponds to the number of micromirrors constituting the DMD, and it can be changed as appropriate.

In this embodiment, the field lens MFi and the imaging lens Mi are constituted separately from each other. The field lens MFi and the imaging lens Mi may be integrated with each other by forming an original such that one surface of the original has the function as a field lens and the other surface of the original has the function as an imaging lens.

Effective diameters of the lens cells constituting the field lens MFi and the imaging lens Mi are supposed to have sizes ranging from several tens to several hundreds of μm. When those minute lens cells are difficult to form in both the surfaces of the original with high accuracy, it is effective to separately constitute the field lens MFi and the imaging lens Mi from each other as in this embodiment.

Figure 2:
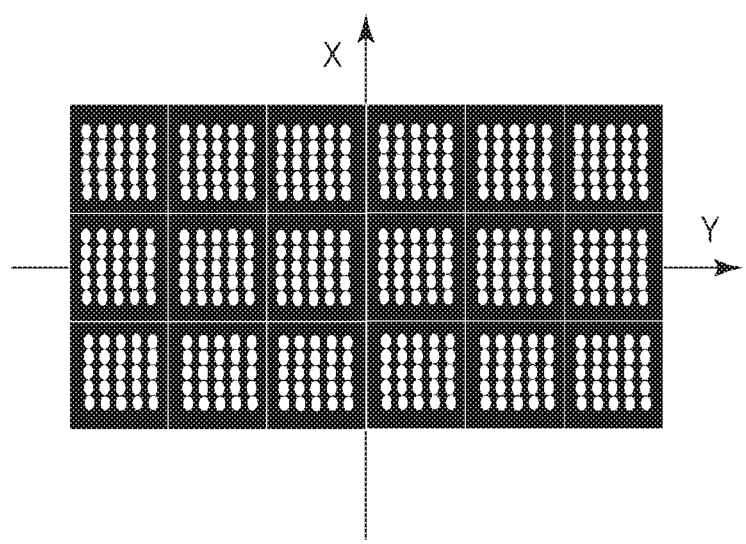
FIG. 2 represents an illuminance distribution in micromirrors constituting a DMD.

FIG. 2 represents a distribution of spot lights in the micromirrors constituting the DMD. The individual lens cells constituting the imaging lens Mi are in a 1:1 correspondence relation to the individual mirrors constituting the DMD as illustrated in FIG. 1, and FIG. 2 illustrates a distribution of spot lights formed in the eighteen mirrors. As seen from FIG. 2, in each mirror, five spot lights are arrayed in each of the X-axis direction and the Y-axis direction, and the individual spot lights are condensed almost uniformly. It is also seen that no spot lights are formed in peripheral regions of the mirrors constituting the DMD and the gaps between adjacent twos of the mirrors constituting the DMD.

According to this embodiment, as described above, the plurality of light fluxes divided by the fly-eye lens FE is incident on the substantial incident surface of the microlens array MLAi through the optical system IL2. Furthermore, the so-called Koehler illumination system is formed in which the exit surface of the fly-eye lens FE is positioned in the front-side focal plane of the optical system IL2 and the exit surface of the field lens MFi is positioned in the rear-side focal plane of the optical system IL2. As a result, the incident surface of the microlens array can be illuminated almost uniformly.

Moreover, the exit surface of the fly-eye lens FE and the incident surface of the imaging lens Mi are in a conjugate relation, and the plurality of spot lights corresponding to the plurality of spot lights formed in the exit surface of the fly-eye lens FE are formed in one lens cell of the imaging lens Mi. In addition, the light fluxes exiting from the microlens array MLAi are imaged on the micromirrors constituting the DMD such that the individual lens cells constituting the imaging lens Mi are in a 1:1 correspondence relation to the individual mirrors constituting the DMD. It is hence possible to prevent reduction in resolution performance of the exposure light, which is caused by lights reflected from the peripheral regions of the mirrors, the gaps between adjacent twos of the mirrors constituting the DMD, and the likes.

Next, the configuration of the projection optical system PO will be described. A light flux reflected by each of the micromirrors constituting the DMD enters an optical system PO1 constituting the projection optical system PO. The optical system PO1 has the function of condensing the light flux being incident on the optical system PO1 on a microlens array MLAp. The microlens array MLAp has a similar structure to that of the microlens array MLAi included in the illumination optical system IL, and it is constituted by a field lens MFp and an imaging lens Mp that is arranged at a position away from the field lens MFp through a distance corresponding to the focal length of the field lens MFp.

The light flux having been imaged at the field lens MFp by the optical system PO1 is re-imaged by the imaging lens Mp. In this embodiment, a point at which the light flux is re-imaged by the imaging lens Mp is positioned inside the imaging lens Mp. The light flux from the re-imaging point is imaged again by an optical system PO2, and a pinhole member PH is arranged at a position at which the light flux is imaged by the optical system PO2.

Individual openings of the pinhole member correspond to positions of micromirrors constituting the DMD in a one-to-one relation. A spot light having a diameter reduced by the pinhole member is incident on the substrate PL through an optical system PO3. When the diameter of the spot light formed by the optical system PO2 is sufficiently small, the pinhole member PH and the optical system PO3 are not needed.

Second Embodiment

Figure 3:
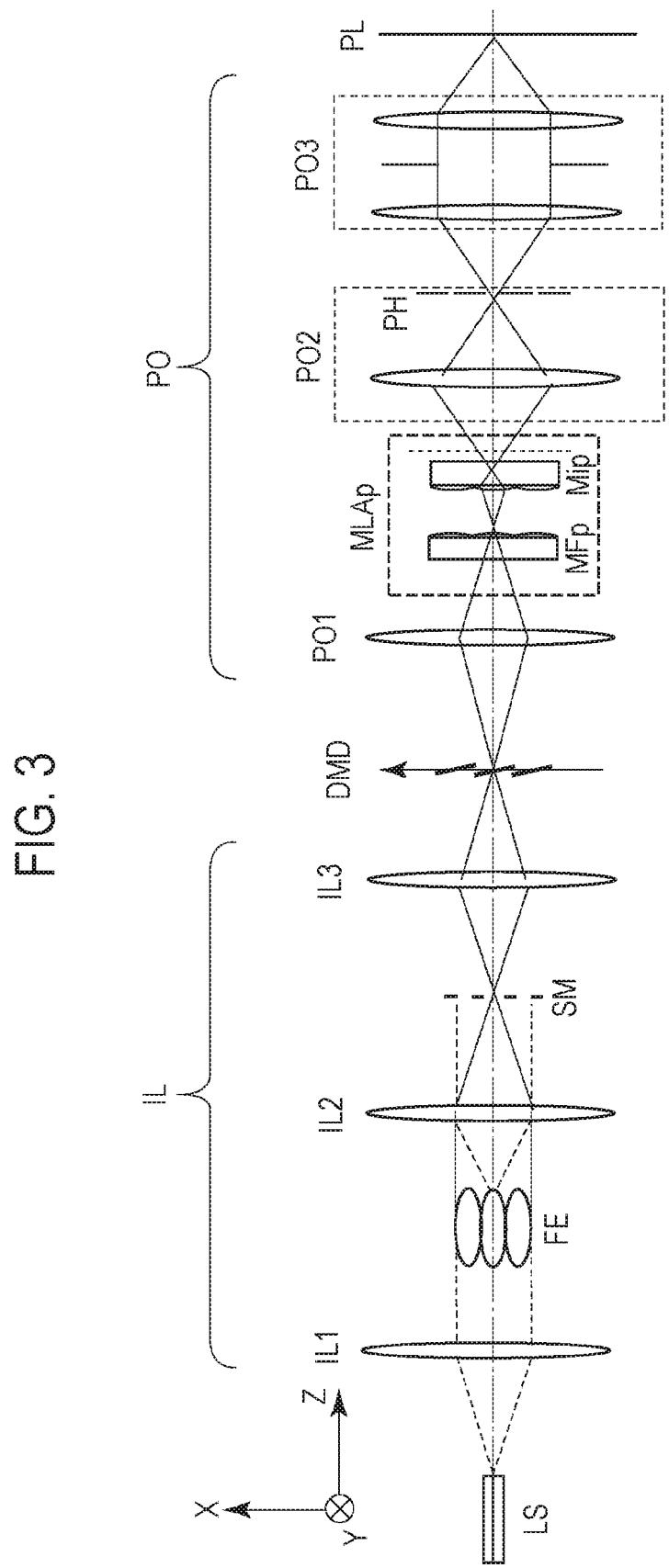
FIG. 3 illustrates a configuration of an illumination optical system according to a second embodiment.

Configurations of an illumination optical system IL and a projection optical system PO according to a second embodiment will be described below with reference to FIG. 3. A configuration of the projection optical system PO in the second embodiment is the same as that of the projection optical system PO in the first embodiment. In comparison with the first embodiment, the second embodiment is different in part of the configuration of the illumination optical system IL. More specifically, a light-shielding member SM including a plurality of openings is disposed instead of the microlens array MLAi in the first embodiment.

In the second embodiment, the light-shielding member SM is arranged in the rear-side focal plane of the optical system IL2. With such an optical arrangement, as described in the first embodiment, the light-shielding member SM is almost uniformly illuminated with the light flux exiting from the fly-eye lens FE.

Openings formed in the light-shielding member SM and mirrors constituting the DMD correspond to each other in a one-to-one relation, and a light flux having passed through the opening of the light-shielding member SM illuminates the mirror of the DMD by the function of the optical system IL3. Each opening of the light-shielding member SM has a size corresponding to an illumination region of each mirror of the DMD. In other words, the illumination region of the mirror can be changed by changing the size of the opening of the light-shielding member SM.

In this embodiment, the size of the opening of the light-shielding member SM is set appropriately such that a peripheral region of the mirror of the DMD is not illuminated with light.

Figure 4:
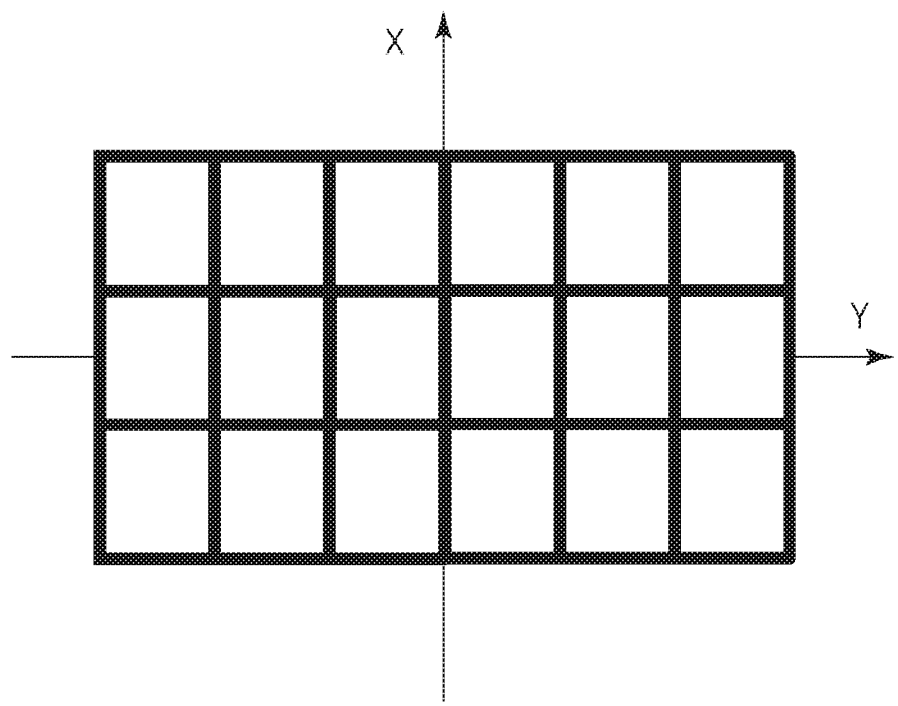
FIG. 4 represents an illuminance distribution in micromirrors constituting a DMD.

FIG. 4 represents an illuminance distribution in the micromirrors constituting the DMD. As seen from FIG. 4, the peripheral region of each mirror is not illuminated with light.

The light-shielding member SM is made of metal, for example. Because metal has high light reflectivity, light-shielding performance of the light-shielding member SM can be increased by using metal as a material of the light-shielding member SM. As an alternative, the light-shielding member SM may be coated with a dielectric film.

(Configuration of Maskless Exposure Apparatus)

A configuration of the maskless exposure apparatus including the illumination optical system IL, the projection optical system PO, and the DMD will be described below with reference to FIG. 5. For convenience of explanation, in FIG. 1, the optical paths passing through the illumination optical system IL, the DMD, and the projection optical system PO are illustrated in the developed form. In fact, as illustrated in FIG. 5, the light flux having passed through the illumination optical system IL is bent by a beam splitter BS and is almost perpendicularly incident on the DMD.

Because the light flux having passed through the illumination optical system IL is almost perpendicularly incident on the DMD, the spot light formed in each lens cell of the imaging lens Mi illustrated in FIG. 1 can be imaged on the DMD with high accuracy. Furthermore, the light having passed through the opening of the light-shielding member SM illustrated in FIG. 3 can be imaged on the DMD with high accuracy. The light flux reflected by each micromirror of the DMD passes through the beam splitter BS and then enters the projection optical system PO. Then, a spot light formed by the projection optical system PO is incident on the substrate PL.

Figure 5:
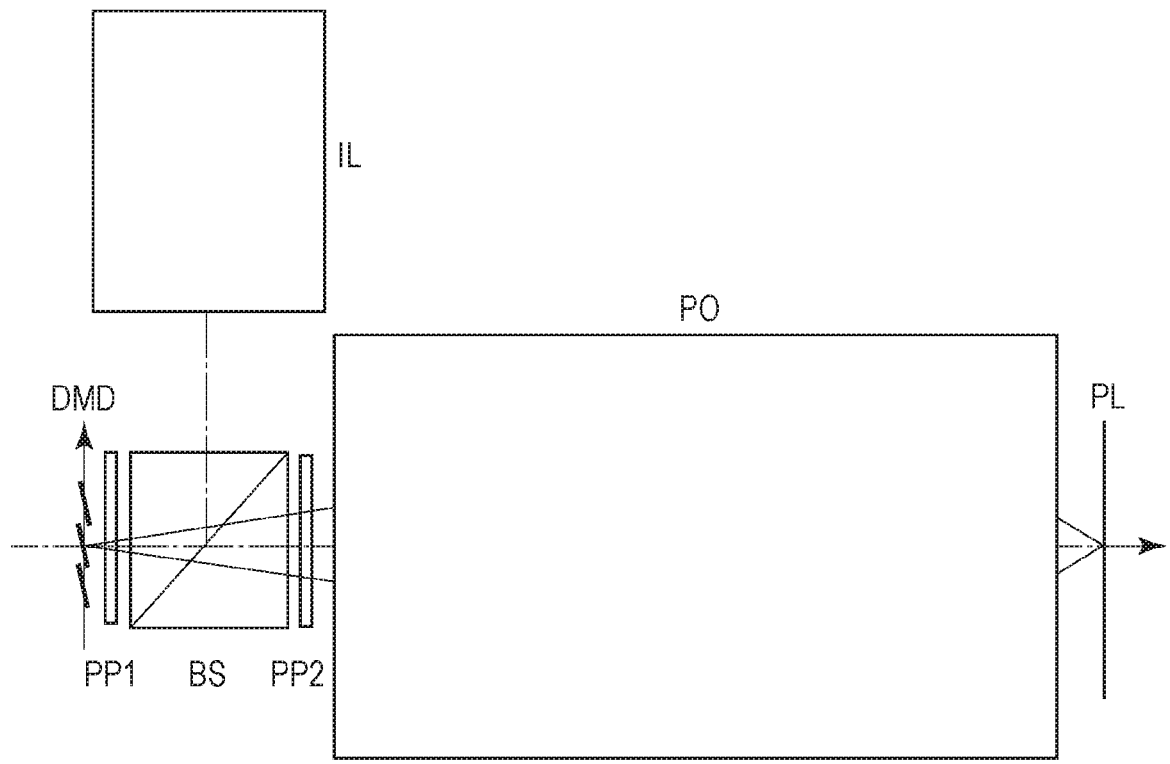
FIG. 5 illustrates a configuration of an exposure apparatus including the illumination optical system according to the present invention.
Figure 6:
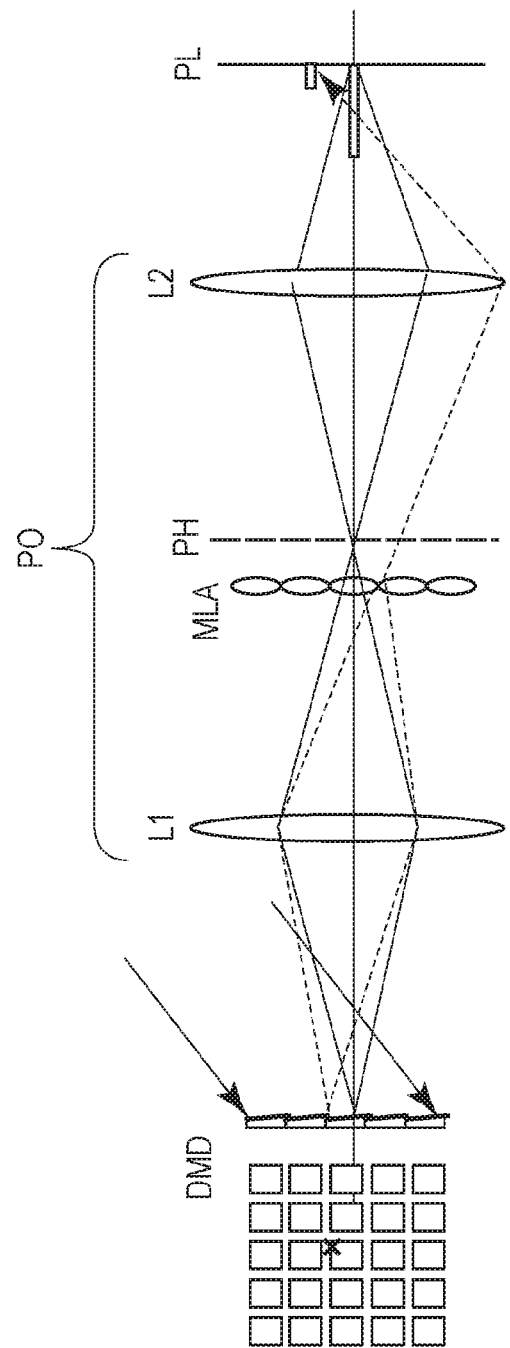
FIG. 6 is an explanatory view referenced to explain a problem with the related art.

In FIG. 5, after the light flux having passed through the illumination optical system IL is reflected by the beam splitter BS and further reflected by the mirror of the DMD, the light flux passes through the beam splitter BS and then enters the projection optical system PO. However, the maskless exposure apparatus may be configured as follows. The light flux having passed through the illumination optical system IL passes through the beam splitter BS and, after having been reflected by the mirror of the DMD, the light flux is reflected by the beam splitter BS and then enters the projection optical system PO.

Here, when a polarization separation film is not applied to the beam splitter BS, the light flux having passed through the illumination optical system IL undergoes a light quantity loss of about 50% each time the light flux is reflected by and passes through the beam splitter BS. In other words, a light quantity loss of about 75% occurs until the light flux enters the projection optical system PO after having passed through the illumination optical system IL.

In the present invention, the beam splitter BS is given with polarization separation characteristics in order to reduce the above-mentioned light quantity loss. Such a beam splitter is called a polarizing beam splitter. The beam splitter BS has characteristics of allowing P-polarized light to pass therethrough and reflecting S-polarized light. Furthermore, a $\lambda/4$ phase plate PP1 is arranged between the beam splitter BS and the DMD.

When the light exiting from the illumination optical system IL is non-polarized light, the light reflected by the beam splitter BS becomes S-polarized light, and after passing through the λ/4 phase plate PP1 and having been reflected by the mirrors constituting the DMD, the S-polarized light passes through the λ/4 phase plate PP1 again. By passing through the λ/4 phase plate PP1 twice, the S-polarized light reflected by the beam splitter BS becomes P-polarized light. Because the beam splitter BS allows the P-polarized light to pass therethrough, the P-polarized light having entered the beam splitter BS passes as it is through the beam splitter BS. In other words, the light quantity loss generated until the light flux enters the projection optical system PO after having passed through the illumination optical system IL can be reduced to about 50%.

In addition, as illustrated in FIG. 5, a 214 phase plate PP2 may be arranged between the beam splitter BS and the projection optical system PO. Reduction in pattern resolution performance attributable to a polarization state can be suppressed by converting the P-polarized light to circular polarized light through the λ/4 phase plate PP2 and causing the circular polarized light to enter the projection optical system PO such that the circular polarized light is incident on the substrate PL. It is effective to make the circular polarized light be incident on the substrate, for example, when photosensitive characteristics of a resist are different depending on the polarization state.

(Modifications)

While the above embodiments have been described on an assumption that the lens cells constituting the fly-eye lens FE are spherical lenses, the lens cells constituting the fly-eye lens FE may be cylindrical lenses. When the number of arrayed micromirrors constituting the DMD is different between the X axis and the Y axis as illustrated in FIG. 2, the lengths of the entire DMD in the X-axis direction and the Y-axis direction are different from each other. In such a case, by using, as the lens cells constituting the fly-eye lens FE, cylindrical lenses each having different focal lengths between the X-axis direction and the Y-axis direction, the shape of the spot light can be made different between the X-axis direction and the Y-axis direction, and illumination efficiency can be improved.

Furthermore, while in the above-described embodiments a light intensity distribution of the light flux emitted from the light source LS is made uniform by using the fly-eye lens FE, another means for making the uniform light intensity distribution, such as an optical integrator, may also be used instead of the fly-eye lens FE. When the optical integrator is used instead of the fly-eye lens FE, the light flux having been made uniform by the optical integrator is condensed on the imaging lens Mi. In such a case, an imaging magnification between an optical image in an exit surface of the optical integrator and an optical image in the incident surface of the imaging lens Mi is set such that the light flux exiting from the optical integrator is condensed on one of the lens cells constituting the imaging lens Mi.

According to the present invention, the illumination optical system and the exposure apparatus each capable of realizing an improvement in resolution performance of exposure light are obtained.

(Article Manufacturing Method)

An article manufacturing method according to an embodiment of the present invention is suitable for manufacturing articles, for example, micro-devices, such as a semiconductor device, and elements having microstructures. The article manufacturing method according to this embodiment includes a step of forming a latent image pattern in a photoresist, which is applied to a substrate, by using the above-described exposure apparatus (i.e., a step of performing exposure on a substrate), and a step of developing the substrate on which the latent image pattern has been formed in the above step. The article manufacturing method further includes other known steps (such as oxidation, film formation, vapor deposition, doping, planarization, etching, resist removal, dicing, bonding, and packaging). The article manufacturing method according to this embodiment is more advantageous than the related-art method in at least one among performance, quality, productivity, and production costs of the articles.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus, comprising:
   an illumination optical system illuminating an optical modulation unit including a plurality of optical modulation elements with a light flux emitted from a light source, and;
   a projection optical system projecting light from the optical modulation unit on a substrate,
   wherein the illumination optical system includes:
   a first lens array including a plurality of lens cells dividing the light flux emitted from the light source into a plurality of light fluxes;
   a second lens array including lens cells on which spot lights exiting from the lens cells included in the first lens array are condensed;
   a first optical member imaging the spot light, which has been condensed on the lens cell included in the second lens array, on one of the optical modulation elements constituting the optical modulation unit; and
   a second optical member arranged between the first lens array and the second lens array,
   wherein the second lens array is constituted by a field lens and an imaging lens, the imaging lens being located at a position away from the field lens through a focal length of the field lens,
   wherein a focal length of the second optical member is longer than the focal length of the field lens,
   wherein the lens cells included in the second lens array and the optical modulation elements included in the optical modulation unit correspond to each other in a one-to-one relation, and
   wherein the spot lights formed on respective lenses of the imaging lens are imaged on respective elements of the plurality of optical modulation elements which correspond to respective lenses of the imaging lens in a one-to-one relation by the first optical member such that the spot lights are not incident on a gap between the plurality of optical modulation elements.

2. The exposure apparatus,
   wherein the first lens array is arranged such that an exit surface of the first lens array is positioned in a front-side focal plane of the second optical member, and
   wherein the second lens array is arranged such that an incident surface of the second lens array is positioned in a rear-side focal plane of the second optical member.

3. The exposure apparatus according to claim 1,
   wherein the plurality of spot lights are condensed on the lens cell included in the second lens array.

4. The exposure apparatus according to claim 3,
wherein the first optical member images the plurality of spot lights, which have been condensed on the lens cell included in the second lens array, on one of the optical modulation elements constituting the optical modulation unit.

5. The exposure apparatus according to claim 1, wherein the optical modulation unit is a micromirror device including a plurality of two-dimensionally arrayed micromirrors, each of the micromirrors having a reflective surface which reflects a light flux from the illumination optical system and an angle of the reflective surface being able to be changed.

6. The exposure apparatus according to claim 1, further comprising a polarizing beam splitter and a phase plate that are arranged between the illumination optical system and the optical modulation unit.

7. The exposure apparatus according to claim 6, wherein the light flux from the illumination optical system is converted to circular polarized light through the polarizing beam splitter and the phase plate, and the circular polarized light is incident on the projection optical system.

8. An article manufacturing method comprising steps of:
performing exposure on a substrate by using the exposure apparatus according to claim 1; and
developing the substrate that has been subjected to the exposure in the exposure step.

9. The exposure apparatus according to claim 1, wherein the imaging lens and the optical modulation unit are in a conjugate relation via the first optical member.

10. An exposure apparatus comprising:
an illumination optical system illuminating an optical modulation unit including a plurality of optical modulation elements with a light flux emitted from a light source; and
a projection optical system projecting light from the optical modulation unit on a substrate,
wherein the illumination optical system includes:
an integrator making a light intensity distribution of the light flux emitted from the light source be uniform;
a lens array including lens cells on which a light flux having passed through the integrator is condensed;
a first optical member imaging the light flux, which has been condensed on the lens cell, on one of the optical modulation elements constituting the optical modulation unit; and
a second optical member arranged between the integrator and the lens array,
wherein the lens array is constituted by a field lens and an imaging lens, the imaging lens being located at a position away from the field lens through a focal length of the field lens,
wherein a focal length of the second optical member is longer than the focal length of the field lens,
wherein the lens cells included in the lens array and the optical modulation elements included in the optical modulation unit correspond to each other in a one-to-one relation, and
wherein respective light fluxes formed on respective lenses of the imaging lens are imaged on respective elements of the plurality of optical modulation elements which correspond to respective lenses of the imaging lens in a one-to-one relation by the first optical member such that the light flux is not incident on a gap between the plurality of optical modulation elements.

11. The exposure apparatus according to claim 10, wherein the optical modulation unit is a micromirror device including a plurality of two-dimensionally arrayed micromirrors, each of the micromirrors having a reflective surface which reflects a light flux from the illumination optical system and an angle of the reflective surface being able to be changed.

12. The exposure apparatus according to claim 10, further comprising a polarizing beam splitter and a phase plate that are arranged between the illumination optical system and the optical modulation unit.

13. The exposure apparatus according to claim 12, wherein the light flux from the illumination optical system is converted to circular polarized light through the polarizing beam splitter and the phase plate, and the circular polarized light is incident on the projection optical system.

14. An article manufacturing method comprising steps of:
performing exposure on a substrate by using the exposure apparatus according to claim 10; and
developing the substrate that has been subjected to the exposure in the exposure step.

15. The exposure apparatus according to claim 10, wherein the imaging lens and the optical modulation unit are in a conjugate relation via the first optical member.

* * * * *